(12) United States Patent
Xu

(10) Patent No.: US 9,257,290 B2
(45) Date of Patent: Feb. 9, 2016

(54) LOW TEMPERATURE POLY-SILICON THIN FILM TRANSISTOR AND MANUFACTURING METHOD THEREOF

(71) Applicant: SHENZHEN CHINA STAR OPTOELECTRONICS TECHNOLOGY CO., LTD., Shenzhen, Guangdong (CN)

(72) Inventor: Xiangyang Xu, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/241,764

(22) PCT Filed: Jan. 23, 2014

(86) PCT No.: PCT/CN2014/071266
§ 371 (c)(1),
(2) Date: Feb. 27, 2014

(87) PCT Pub. No.: WO2015/096264
PCT Pub. Date: Jul. 2, 2015

(65) Prior Publication Data
US 2015/0179460 A1  Jun. 25, 2015

(30) Foreign Application Priority Data
Dec. 25, 2013  (CN) .......................... 2013 1 0727131

(51) Int. Cl.
| | |
|---|---|
| *H01L 21/00* | (2006.01) |
| *H01L 21/28* | (2006.01) |
| *H01L 29/66* | (2006.01) |
| *H01L 29/786* | (2006.01) |
| *H01L 29/51* | (2006.01) |

(52) U.S. Cl.
CPC ........ *H01L 21/28229* (2013.01); *H01L 29/513* (2013.01); *H01L 29/66757* (2013.01); *H01L 29/78675* (2013.01)

(58) Field of Classification Search
CPC .................. H01L 21/28229; H01L 29/66757; H01L 29/78675; H01L 29/513
USPC .................. 257/59, 72, 43; 438/151, 154
See application file for complete search history.

(56) References Cited

U.S. PATENT DOCUMENTS

| 7,608,475 | B2 | 10/2009 | Liao et al. | |
|---|---|---|---|---|
| 2005/0090045 | A1* | 4/2005 | Chang ........................... | 438/151 |
| 2006/0030090 | A1* | 2/2006 | Huang et al. .................. | 438/154 |

(Continued)

FOREIGN PATENT DOCUMENTS

| CN | 1691340 A | 11/2005 |
|---|---|---|
| CN | 101355089 | 1/2009 |

OTHER PUBLICATIONS

International Search Report dated Oct. 10, 2014.

*Primary Examiner* — Tan N Tran
(74) *Attorney, Agent, or Firm* — Stein IP, LLC

(57) ABSTRACT

The present disclosure relates to a low temperature poly-silicon thin film transistor which possesses electrical characteristics and reliability, and a method of manufacturing the thin film transistor. The low temperature poly-silicon thin film transistor at least includes a gate insulating layer which is a composite insulating layer comprising at least three dielectric layers, wherein the compactness of each dielectric layer successively increases in order of the formation sequence thereof in the manufacturing process. Because the relation between the compactness of each layer of the composite insulating layer and that of the others thereof is taken into account according to the present disclosure, each layer in the composite insulating layer of the low temperature poly-silicon thin film transistor manufactured by the method according to the present disclosure can have enhanced surface contact characteristic and thin film continuity. The thickness of each layer in the composite insulating layer is further considered, so that the parasitic capacitance can be effectively reduced, and thus the response rate of the transistor can be improved. Namely, by improving the GI film forming quality, the electrical characteristic and reliability of the low temperature poly-silicon thin film transistor can be improved.

4 Claims, 2 Drawing Sheets

(56) References Cited

U.S. PATENT DOCUMENTS

| | | | |
|---|---|---|---|
| 2006/0163580 A1* | 7/2006 | Yamazaki et al. | 257/59 |
| 2011/0006301 A1* | 1/2011 | Yamazaki et al. | 257/43 |
| 2011/0101333 A1* | 5/2011 | Shionoiri et al. | 257/43 |
| 2014/0104151 A1* | 4/2014 | Yamazaki et al. | 345/94 |

* cited by examiner

LOW TEMPERATURE POLY-SILICON THIN FILM TRANSISTOR AND MANUFACTURING METHOD THEREOF

FIELD OF THE INVENTION

The present disclosure relates to the technical field of the production process of low temperature poly-silicon thin film transistors, in particular to a low temperature poly-silicon thin film transistor which possesses electrical characteristics and reliability, and a method of manufacturing the thin film transistor.

BACKGROUND OF THE INVENTION

Liquid Crystal Display (LCD) is the most mature flat-panel display technology at present. For example, mobile phones, digital cameras, video cameras, notebook computers, and monitors, which are commonly used in daily life, are all manufactured by this technology.

However, as the application areas of new technologies expand and people's requirement for the visual appeal of the display becomes higher, a flat-panel display with higher image quality, high definition, high brightness, and low price has become the direction and motivation for the development of the upcoming display technology. A Low Temperature Poly-silicon (LTPS) thin film transistor (TFT) in the flat-panel display, apart from its active driving characteristic, is exactly an important technical breakthrough to achieve the above objectives.

Traditional LTPS TFT, as shown in FIG. 1, includes a glass substrate 101 and a buffer layer 102 arranged on the glass substrate 101. On the buffer layer 102, a poly-silicon layer is formed, which comprises a source electrode arranged in a source region 103, a drain electrode arranged in a drain region 104, and a gate insulating layer GI arranged on a channel region 111. A gate electrode 108 and a passivation layer 109 are formed on the GI layer. The GI layer generally adopts a two-layer composite structure comprising a dielectric layer 105 and a dielectric layer 107, which are generally made from $SiO_2$ and $SiN_x$.

However, the gate insulating layer formed by $SiN_x$ and $SiO_2$ suffers from poor surface contact performance and thin film continuity, as well as undercuts when via holes are formed thereon, which means that $SiO_2$ holes are greater than $SiN_x$ holes due to a higher etching rate of $SiO_2$ than that of $SiN_x$, thus leading to poor contact performance.

Therefore, in order to solve the above-mentioned problems, it is a major subject of efforts in this industry to provide a method for manufacturing a low temperature poly-silicon thin film transistor which has relatively strong contact continuity, and can effectively reduce the parasitic capacitance and thus improve the response rate of the transistor.

SUMMARY OF THE INVENTION

One of the technical problems to be solved by the present disclosure is to provide a method for manufacturing a low temperature poly-silicon thin film transistor which has relatively strong contact continuity and can effectively reduce the parasitic capacitance and then improve the response rate of the transistor. In addition, the present disclosure further provides a low temperature poly-silicon thin film transistor.

(1) To solve the above-mentioned technical problems, the present disclosure provides a method for manufacturing a low temperature poly-silicon thin film transistor, including the following steps: providing an insulating substrate; forming, on a buffer layer of the insulating substrate, at least one poly-silicon layer, on the surface of which a source region, a drain region, and a channel region of the low temperature poly-silicon thin film transistor are arranged; conducting a plasma enhanced chemical vapor deposition (PECVD) procedure for at least three times to form at least three dielectric layers on the channel region successively, such that a composite gate insulating layer is formed, wherein the compactness of each dielectric layer increases in order of the formation sequence thereof in the manufacturing method; and forming a gate electrode on the composite gate insulating layer.

(2) In a preferred embodiment according to (1) of the present disclosure, the composite gate insulating layer comprises a first dielectric layer, a second dielectric layer, and a third dielectric layer, wherein the first dielectric layer is made from $SiO_2$, the second dielectric layer is made from SiON, and the third dielectric layer is made from $SiN_x$.

(3) In a preferred embodiment according to (1) or (2) of the present disclosure, the film thickness of the first dielectric layer is greater than those of both the second and the third dielectric layers.

(4) In a preferred embodiment according to any one of (1) to (3) of the present disclosure, the thickness of $SiO_2$ film of the first dielectric layer is in a range of from 1,000 to 1,500 angstroms, the thickness of SiON film of the second dielectric layer is in a range of from 100 to 1,000 angstroms, and the thickness of $SiN_x$ film of the third dielectric layer is in a range of from 100 to 500 angstroms.

(5) In a preferred embodiment according to any one of (1) to (4) of the present disclosure, the formation of the poly-silicon layer includes the following steps: performing a sputtering procedure so as to form an amorphous silicon layer on the surface of the insulating substrate, and performing an annealing procedure so that the amorphous silicon layer re-crystallizes and forms the poly-silicon layer, wherein the annealing procedure includes an excimer laser annealing operation.

(6) In a preferred embodiment according to any one of (1) to (5) of the present disclosure, after the gate electrode is formed, an ion implantation procedure using the gate electrode as a mask is performed to form a source electrode and a drain electrode in the source region and the drain region respectively on the poly-silicon layer; and after the ion implantation procedure, an activation procedure is performed to activate dopants in both the source electrode and the drain electrode.

(7) According to another aspect of the present disclosure, a low temperature poly-silicon thin film transistor is further provided, at least includes a gate insulating layer which is a composite insulating layer comprising at least three dielectric layers, wherein the compactness of each dielectric layer successively increases in order of the formation sequence thereof in the manufacturing process.

(8) In a preferred embodiment according to (7) of the present disclosure, the gate insulating layer comprises a first dielectric layer, a second dielectric layer, and a third dielectric layer. The first dielectric layer is made from $SiO_2$, the second dielectric layer is made from SiON, and the third dielectric layer is made from $SiN_x$.

(9) In a preferred embodiment according to (7) or (8) of the present disclosure, the film thickness of the first dielectric layer is greater than those of both the second and the third dielectric layers.

(10) In a preferred embodiment according to any one of (7) to (9) of the present disclosure, the thickness of $SiO_2$ film of the first dielectric layer is in a range of from 1,000 to 1,500 angstroms, the thickness of SiON film of the second dielectric layer is in a range of from 100 to 1,000 angstroms, and the thickness of $SiN_x$ film of the third dielectric layer is in a range of from 100 to 500 angstroms.

Compared with the prior art, one or more examples of the present disclosure enjoy the following advantages. Because the relation between the compactness of each layer of the composite insulating layer and that of the others thereof is taken into account according to the present disclosure, each layer in the composite insulating layer of the low temperature poly-silicon thin film transistor obtained by the method according to the present disclosure can have enhanced surface contact characteristic and thin film continuity. The thickness of each layer in the composite insulating layer is further considered, so that the parasitic capacitance can be effectively reduced, and thus the response rate of the transistor can be improved.

Other features and advantages of the present disclosure will be illustrated and partially become clear in the following description, or will be understood through implementing the present disclosure. The objectives and other advantages of the present disclosure can be achieved and obtained based on the structures specified in the description, claims, and accompanying drawings.

BRIEF DESCRIPTION OF THE DRAWINGS

The accompanying drawings, which constitute a part of the description, are provided to further illustrate the present disclosure in conjunction with the examples. They should not be construed as limitation to the present disclosure. In the accompanying drawings.

DETAILED DESCRIPTION OF THE EMBODIMENTS

To make the objectives, technical solutions, and the advantages of the present disclosure clearer, the present disclosure will be further illustrated in detail below in conjunction with the accompanying drawings.

Figure 1:
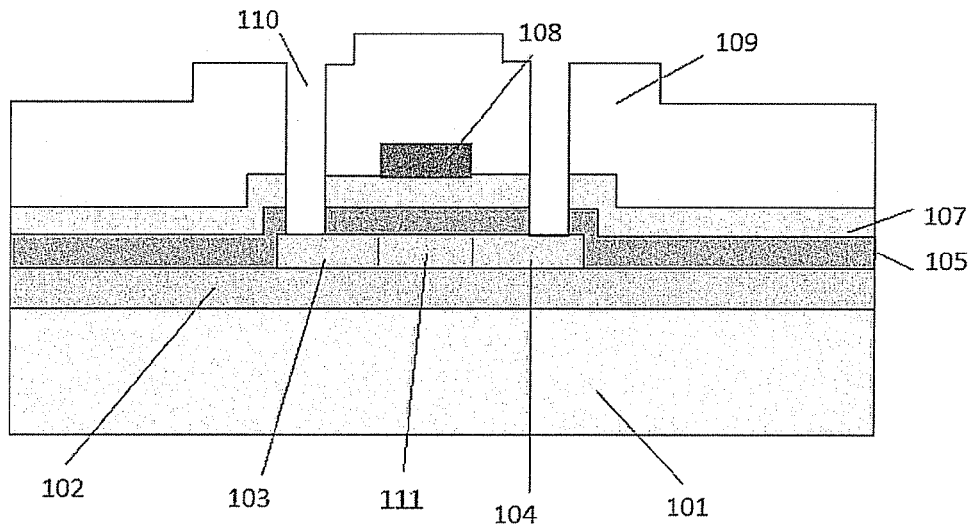
FIG. 1 schematically shows a partial structure of a low temperature poly-silicon thin film transistor in the prior art.
Figure 2:
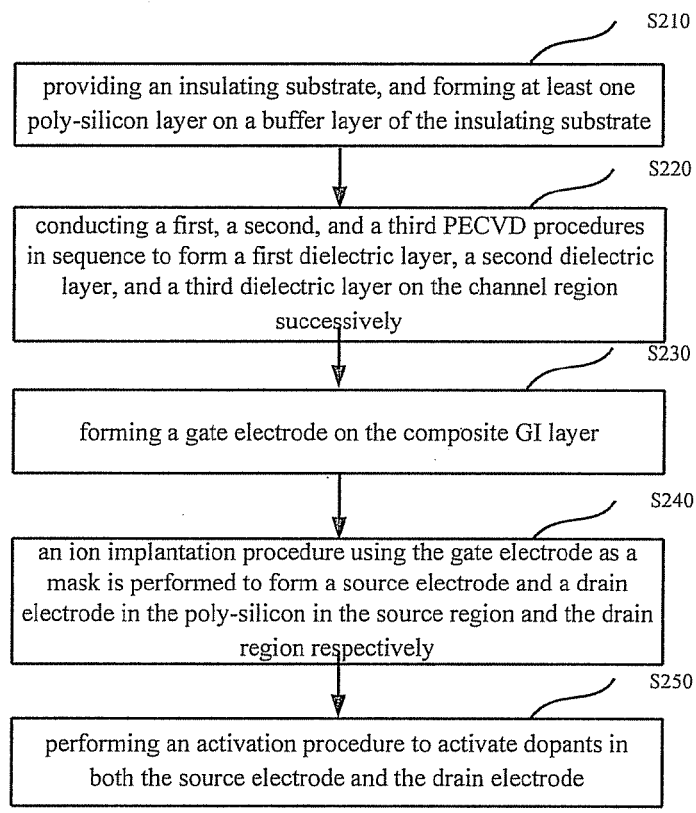
FIG. 2 schematically shows a workflow of a method for manufacturing a low temperature poly-silicon thin film transistor according to an example of the present disclosure.

FIG. 2 schematically shows a workflow of a method for manufacturing a low temperature poly-silicon thin film transistor according to an example of the present disclosure. The method for manufacturing the LTPS TFT will be illustrated below referring to FIG. 2 and FIG. 3.

In Step S210, an insulating substrate 101 is provided, and at least one poly-silicon (LTPS) layer is formed on a buffer layer 102 of the insulating substrate 101. A source region 103, a drain region 104, and a channel region 111 of the LTPS TFT are arranged on the surface of the poly-silicon layer.

It should be noted that the insulating substrate 101 can be a glass substrate or a quartz substrate, and the buffer layer 102 is a $SiO_2$ layer formed on the insulating substrate 101 through PECVD procedure.

In addition, the formation of the LTPS layer also includes the following procedures: first, performing a sputtering procedure to form an amorphous silicon (a-Si) layer on the surface of the insulating substrate 101, and then performing an annealing procedure so that the a-Si layer re-crystallizes and forms the poly-silicon layer. The above-mentioned annealing procedure includes an excimer laser annealing operation.

In Step S220, a first, a second, and a third PECVD procedures are performed in sequence to successively final a first dielectric layer 105, a second dielectric layer 106, and a third dielectric layer 107 on the above-mentioned channel region 111. The three dielectric layers together form a composite gate insulating (GI) layer, wherein the compactness of each dielectric layer successively increases in order of the formation sequence thereof in the manufacturing process, namely, the compactness of the first dielectric layer 105 is smaller than that of the second dielectric layer 106, and the compactness of the second dielectric layer 106 is smaller than that of the third dielectric layer 107.

Specifically, the first dielectric layer 105 is deposited on the surface of the poly-silicon layer through the first PECVD procedure, then the second dielectric layer 106 is deposited on the first dielectric layer 105 through the second PECVD procedure, and subsequently the third dielectric layer 107 is deposited on the second dielectric layer 106 through the third PECVD procedure.

It should be noted that the PECVD procedures of the GI layer are continuously performed in one single wafer reactor.

Preferably, the first dielectric layer 105 of the composite GI layer is made from $SiO_2$, the second dielectric layer 106 is made from SiON, and the third dielectric layer 107 is made from $SiN_x$. The $SiO_2$ in the first dielectric layer 105 of the composite GI layer and the buffer layer 102 is used for improving the interface characteristic of the LTPS, the $SiN_x$ in the third dielectric layer 107 of the composite GI layer is used for blocking water vapor and metal ions, and the SiON in the second dielectric layer 106 mainly functions to improve the interface contact continuity between the first dielectric layer 105 and the third dielectric layer 107 (compactness: $SiN_x > SiON > SiO_2$).

In this case, the composite gate insulating layer comprising the above-mentioned three dielectric layers can not only improve the contact characteristic between itself and the low temperature poly-silicon layer and prevent water vapor and metal ions from entering the interface and the interior of the low temperature poly-silicon layer, but also enhance the surface contact characteristic and thin film continuity.

It should be easily understood that this is merely an example, and the composite insulating layer can include other number of layers, such as four or five layers, that is, one skilled in the art can provide four or five dielectric layers through four or five times of PECVD. It is important to note that the compactness of each layer of the composite insulating layer successively increases in order of the formation sequence thereof in the manufacturing process.

In addition, the film thickness of the first dielectric layer 105 is substantially greater than those of both the second dielectric layer 106 and the third dielectric layer 107. Thus, the parasitic capacitance can be effectively reduced. Preferably, the thickness of the $SiO_2$ film of the first dielectric layer is about 1,000 to 1,500 angstroms, the thickness of the SiON film of the second dielectric layer is about 100 to 1,000 angstroms, and the thickness of the $SiN_x$ film of the third dielectric layer is about 100 to 500 angstroms.

In Step S230, a gate electrode 108 is formed on the composite GI layer.

It should be noted that the material for the above-mentioned gate electrode can be preferably selected from tungsten, chromium, aluminum, molybdenum, and copper.

In Step S240, an ion implantation procedure using the gate electrode 108 as a mask is performed to form a source electrode and a drain electrode in the source region 103 and the drain region 104, respectively, on the above-mentioned poly-silicon layer through via holes 110

In Step S250, an activation procedure is performed to activate dopants in both the source electrode and the drain electrode.

Finally, a PECVD procedure is performed again to form a passivation layer, which can be made from SiO or $SiN_x$.

Figure 3:
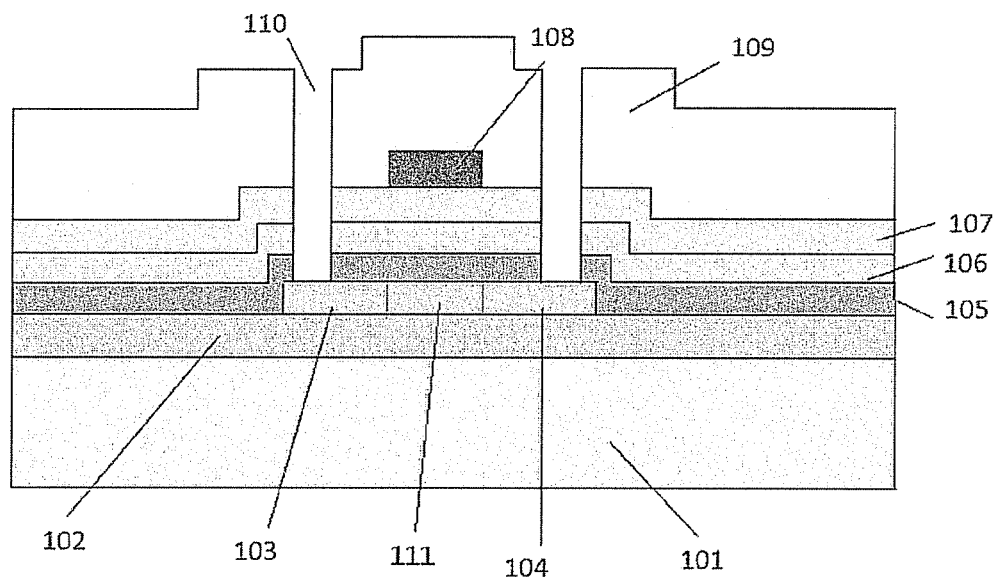
FIG. 3 schematically shows a partial structure of a low temperature poly-silicon thin film transistor according to an example of the present disclosure.

In this case, based on the workflow of the method according to the present disclosure, the structure of the low temperature poly-silicon thin film transistor as shown in FIG. 3 is finally obtained.

In conclusion, because the relation between the compactness of each layer of the composite insulating layer and that of the others thereof is taken into account according to the present disclosure, each layer in the composite insulating layer of the low temperature poly-silicon thin film transistor manufactured by the method according to the present disclosure can have enhanced surface contact characteristic and thin film continuity. The thickness of each layer in the composite insulating layer is further considered, so that the parasitic capacitance can be effectively reduced, and thus the response rate of the transistor can be improved. Namely, by improving the GI film forming quality, the electrical characteristic and reliability of the low temperature poly-silicon thin film transistor can be improved.

The foregoing descriptions are merely preferred embodiments of the present disclosure, which should not be construed as limitation to the scope of the present disclosure. Any changes or substitutions within the technical scope disclosed in the present disclosure, which easily occur to any one skilled in the art, should be contained in the scope of the present disclosure. Accordingly, the scope of the present disclosure should be subjected to the claims.

The invention claimed is:

1. A method for manufacturing a low temperature poly-silicon thin film transistor, including:
    providing an insulating substrate;
    forming, on a buffer layer of the insulating substrate, at least one poly-silicon layer, on the surface of which a source region, a drain region, and a channel region of the low temperature poly-silicon thin film transistor are arranged;
    conducting a plasma enhanced chemical vapor deposition (PECVD) procedure for at least three times to form at least three dielectric layers on the channel region successively, such that a composite gate insulating layer is formed, wherein the compactness of each dielectric layer increases in order of the formation sequence thereof in the manufacturing method; and
    forming a gate electrode on the composite gate insulating layer;
    wherein:
        the composite gate insulating layer comprises a first dielectric layer, a second dielectric layer, and a third dielectric layer, and the first dielectric layer is made from $SiO_2$, the second dielectric layer is made from SiON, and the third dielectric layer is made from $SiN_x$;
    the film thickness of the first dielectric layer is greater than those of both the second and the third dielectric layers; and
    wherein the thickness of $SiO_2$ film of the first dielectric layer is in a range of from 1,000 to 1,500 angstroms, the thickness of SiON film of the second dielectric layer is in a range of from 100 to 1,000 angstroms, and the thickness of $SiN_x$ film of the third dielectric layer is in a range of from 100 to 500 angstroms.

2. The method according to claim 1, wherein the formation of the poly-silicon layer comprises: performing a sputtering procedure so as to form an amorphous silicon layer on the surface of the insulating substrate, and performing an annealing procedure so that the amorphous silicon layer re-crystallizes and forms the poly-silicon layer, wherein the annealing procedure includes an excimer laser annealing operation.

3. The method according to claim 1, wherein after the gate electrode is formed, an ion implantation procedure using the gate electrode as a mask is performed to form a source electrode and a drain electrode in the source region and the drain region respectively on the poly-silicon layer, and after the ion implantation procedure, an activation procedure is performed to activate dopants in both the source electrode and the drain electrode.

4. A low temperature poly-silicon thin film transistor, comprising:
    a gate insulating layer which is a composite insulating layer comprising at least three dielectric layers, a first dielectric layer, a second dielectric layer, and a third dielectric layer, and the first dielectric layer is made from $SiO_2$, the second dielectric layer is made from SiON, and the third dielectric layer is made from $SiN_x$,
    wherein
    the compactness of each dielectric layer successively increases in order of the formation sequence thereof in the manufacturing process;
    the film thickness of the first dielectric layer is greater than those of both the second and the third dielectric layers; and
    wherein the thickness of $SiO_2$ film of the first dielectric layer is in a range of from 1,000 to 1.500 angstroms, the thickness of SiON film of the second dielectric layer is in a range of from 100 to 1,000 angstroms, and the thickness of $SiN_x$ film of the third dielectric layer is in a range of from 100 to 500 angstroms.

* * * * *